US011618057B2

(12) United States Patent
Acosta et al.

(10) Patent No.: US 11,618,057 B2
(45) Date of Patent: Apr. 4, 2023

(54) LOCALIZED HAPTIC FEEDBACK IN ELECTRONIC DEVICES USING PRESSURE-SENSITIVE ADHESIVE AND PIEZOELECTRIC HAPTIC ACTUATORS

(71) Applicant: Google LLC, Mountain View, CA (US)

(72) Inventors: Joshua Acosta, Mountain View, CA (US); Ryan Joseph Yund, San Jose, CA (US)

(73) Assignee: Google LLC, Mountain View, CA (US)

( * ) Notice: Subject to any disclaimer, the term of this patent is extended or adjusted under 35 U.S.C. 154(b) by 324 days.

(21) Appl. No.: 17/076,224

(22) Filed: Oct. 21, 2020

(65) Prior Publication Data
US 2022/0118481 A1   Apr. 21, 2022

(51) Int. Cl.
| *B06B 1/06* | (2006.01) |
| *H01L 41/047* | (2006.01) |
| *G08B 6/00* | (2006.01) |
| *H01L 41/08* | (2006.01) |
| *H01L 41/053* | (2006.01) |

(52) U.S. Cl.
CPC .............. *B06B 1/0644* (2013.01); *G08B 6/00* (2013.01); *H01L 41/0475* (2013.01); *H01L 41/0533* (2013.01); *H01L 41/0825* (2013.01)

(58) Field of Classification Search
CPC .............. H01L 41/1132; H01L 41/0475; H01L 41/0533; H01L 41/0825; B06B 1/0644
USPC ........................................................ 310/339
See application file for complete search history.

(56) References Cited

U.S. PATENT DOCUMENTS

| 4,430,595 | A | * | 2/1984 | Nakasone | ............... | H01L 41/08 |
| | | | | | | 310/339 |
| 6,340,936 | B1 | * | 1/2002 | McGaffey | ............. | G08G 1/095 |
| | | | | | | 340/407.1 |
| 10,026,312 | B1 | * | 7/2018 | George | .................. | H01H 57/00 |
| 2005/0145472 | A1 | * | 7/2005 | Beckwith | ............... | G08G 1/005 |
| | | | | | | 200/521 |
| 2018/0217669 | A1 | | 8/2018 | Ligtenberg et al. | | |

FOREIGN PATENT DOCUMENTS

WO    2012106216    8/2012

* cited by examiner

*Primary Examiner* — Derek J Rosenau
(74) *Attorney, Agent, or Firm* — Colby Nipper PLLC

(57) ABSTRACT

This document describes techniques and apparatuses directed at localized haptic feedback in electronic devices using pressure-sensitive adhesive (PSA) and piezoelectric haptic actuators. In aspects, an electronic device includes a housing having a frame defining a slot. An actuator is adhered to the frame at the bottom of the slot by the PSA. When a force is applied to an exterior surface of the actuator ("button press"), the PSA compresses and an extending member attached to the actuator, opposite the exterior surface, slidably moves within an aperture in the frame at the bottom of the slot. The extending member engages a sensor module (e.g., piezoelectric sensor) and the electronic device registers a button press. The sensor module then applies haptic feedback to the extending member and through the actuator to the exterior surface. When the force is removed from the actuator's exterior surface, the PSA expands to an approximate original thickness.

12 Claims, 5 Drawing Sheets

LOCALIZED HAPTIC FEEDBACK IN ELECTRONIC DEVICES USING PRESSURE-SENSITIVE ADHESIVE AND PIEZOELECTRIC HAPTIC ACTUATORS

SUMMARY

This document describes techniques and apparatuses directed at localized haptic feedback in electronic devices using pressure-sensitive adhesive (PSA) and piezoelectric haptic actuators. In an aspect, an electronic device includes a housing having a frame defining a slot and a support surface at a bottom of the slot. The electronic device further includes an actuator, positioned within the slot, having an exterior surface and a base surface that faces the support surface. The actuator further includes an extending member extending from the base surface ("first end") through an aperture ("second end") in the support surface at the bottom of the slot. The electronic device further includes a sensor module positioned within the housing such that the support surface of the frame is arranged between the sensor module and the base surface of the actuator. In such an arrangement, when a force is applied to the exterior surface of the actuator, the second end of the extending member slidably moves through the aperture in the support surface contacting the sensor module. The sensor module is configured to detect a compression force applied by the second end of the extending member and apply haptic feedback to the second end of the extending member. The electronic device further includes a PSA positioned between the base surface of the actuator and the support surface of the frame. The PSA provides waterproofing capability for the sensor module and forms a compressible interface between the actuator and the sensor module.

In another aspect, a haptic button assembly for electronic devices includes an actuator having an exterior surface and a base surface opposite the exterior surface. The actuator is positioned within a slot defined by a frame of an electronic device, such that the base surface is positioned proximate to a support surface of the frame that defines a bottom of the slot that is opposite an opening of the slot. A PSA is positioned between the base surface of the actuator and the support surface at the bottom of the slot. The PSA forms a compressible interface between the actuator and the frame. The actuator further includes an extending member extending from the base surface ("first end") through an aperture ("second end") in the support surface at the bottom of the slot. A sensor module is positioned proximate to the second end of the extending member. When a user presses on the exterior surface of the actuator causing the extending member to slidably move through the aperture toward the sensor module, the sensor module detects a first compression force applied by the second end of the extending member to the sensor and applies a second compression force to the second end of the extending member in a direction that is substantially opposite to a direction of the first compression force to provide haptic feedback to the user.

This Summary is provided to introduce simplified concepts of techniques and apparatuses directed at localized haptic feedback in electronic devices using pressure-sensitive adhesive and piezoelectric haptic actuators, the concepts of which are further described below in the Detailed Description and Drawings. This Summary is not intended to identify essential features of the claimed subject matter, nor is it intended for use in determining the scope of the claimed subject matter.

BRIEF DESCRIPTION OF THE DRAWINGS

The details of one or more aspects of techniques and apparatuses directed at localized haptic feedback in electronic devices using pressure-sensitive adhesive and piezoelectric haptic actuators are described in this document with reference to the following drawings. The same numbers are used throughout the drawings to reference like features and components.

DETAILED DESCRIPTION

This document describes techniques and apparatuses directed at localized haptic feedback in electronic devices using PSA and piezoelectric haptic actuators. Electronic devices may provide feedback to users through, for example, on-screen visualizations and kinesthetic communication (e.g., haptic technology). This feedback is useful as it informs a user that their input has been registered. Haptic technology, in particular, enables electronic devices to communicate with users at a familiar level by simulating the sensation of touch. Many electronic devices provide this haptic feedback using an eccentric rotating mass that vibrates the electronic device body. For example, a user may press a mechanical button on the surface of an electronic device and receive haptic feedback that vibrates the whole device. However, some users may desire an electronic device that provides localized haptic feedback. For example, a user may press a mechanical button on the surface of an electronic device and receive localized haptic feedback such that only the button vibrates. An electronic device utilizing localized haptic feedback not only informs a user that an action has been registered but further notifies the user which specific action initiated the feedback.

Figure 1:
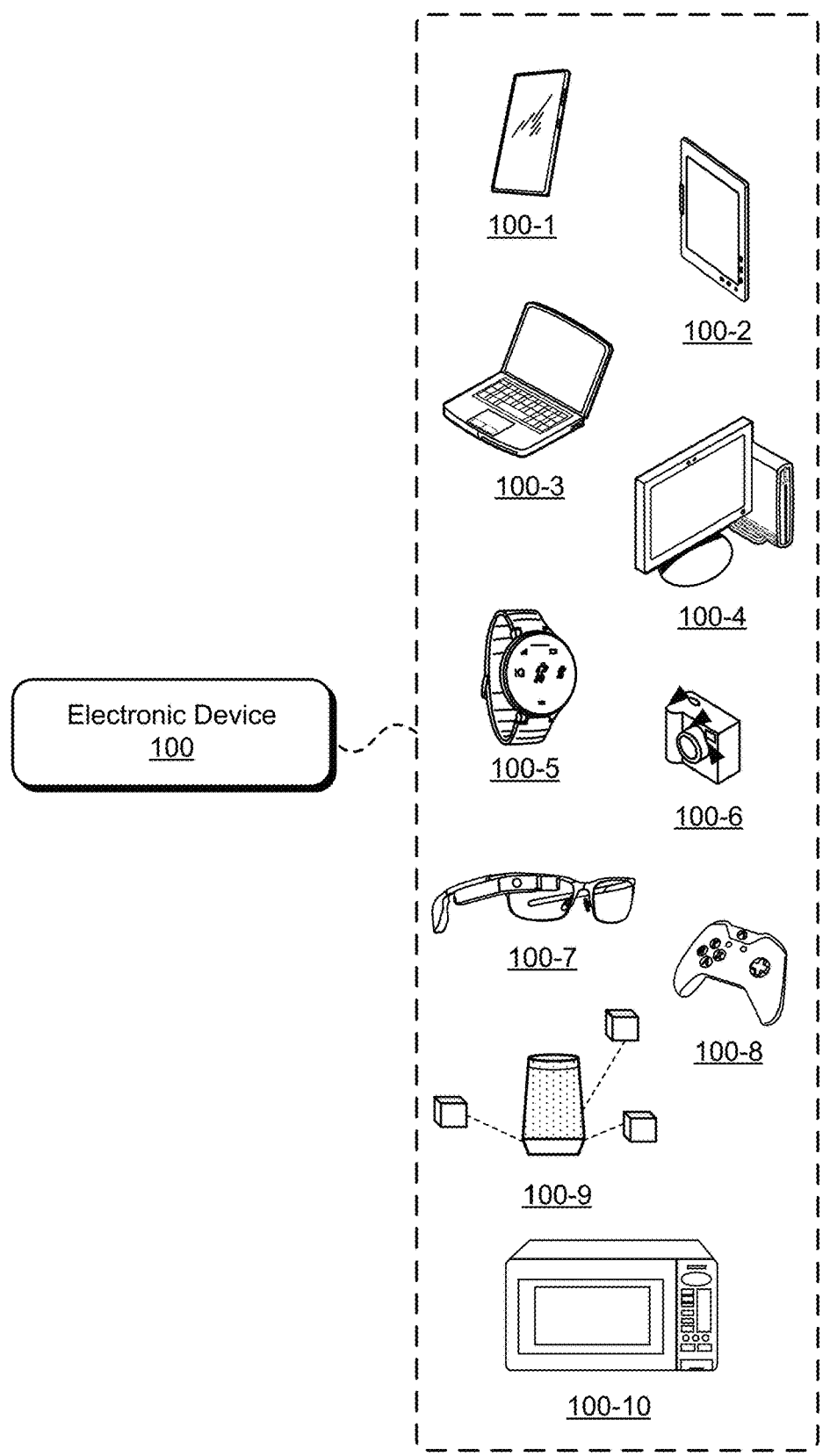
FIG. 1 illustrates example electronic devices.

An electronic device 100 using localized haptic feedback is illustrated in FIG. 1 with a variety of example devices. As illustrated, example devices include a smartphone 100-1, a tablet 100-2, a laptop 100-3, a desktop computer 100-4, a computing watch 100-5, a camera 100-6, computing spectacles 100-7, a gaming system 100-8, a home-automation and control system 100-9, and a microwave 100-10. The electronic device 100 can also include other devices, such as televisions, entertainment systems, audio systems, automobiles, drones, track pads, drawing pads, netbooks, e-readers, home security systems, and other home appliances. Note that the electronic device 100 can be wearable, non-wearable but mobile, or relatively immobile (e.g., desktops and appliances).

Figure 2:
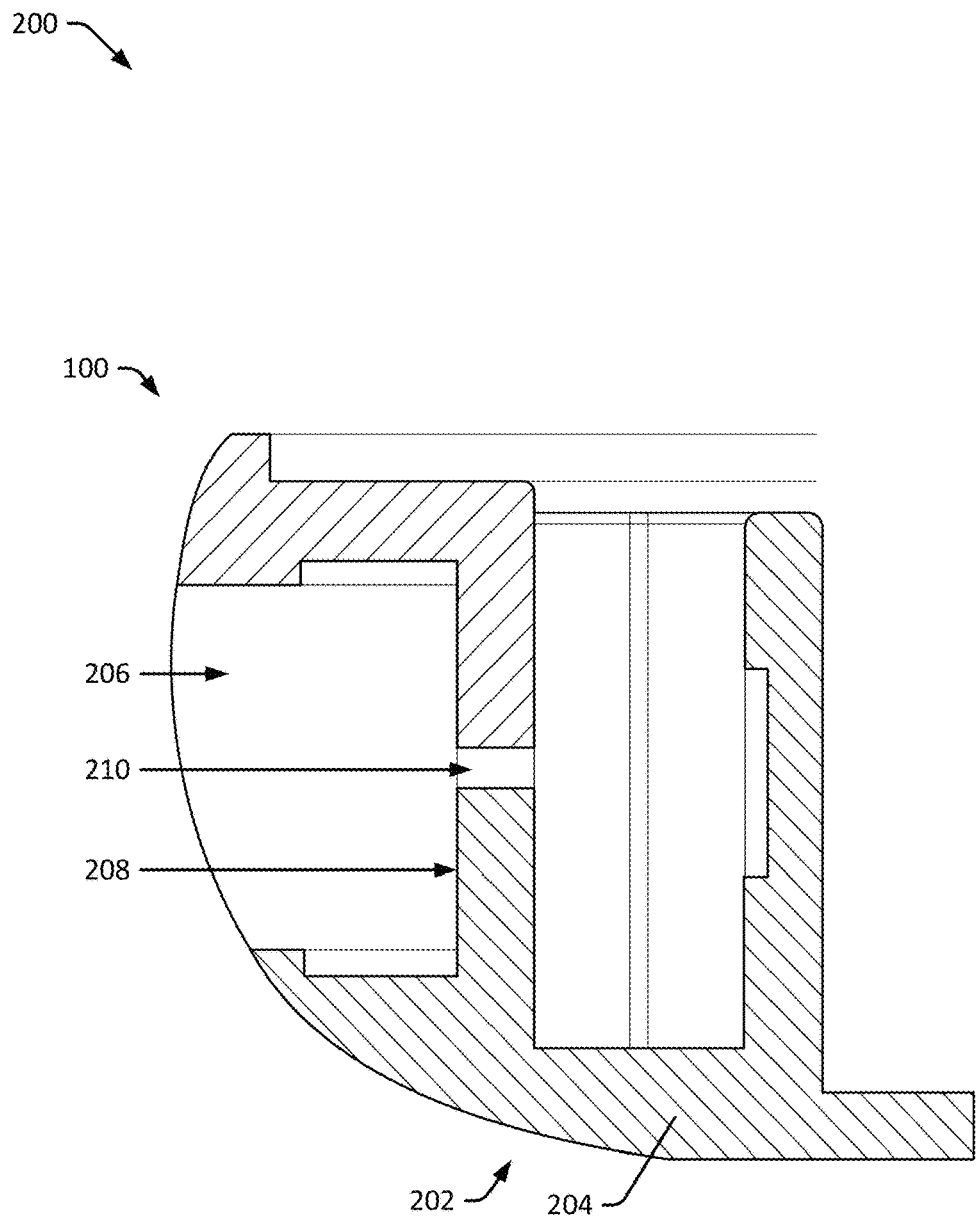
FIG. 2 illustrates a partial, cross-sectional view of an electronic device containing only housing elements.

FIG. 2 illustrates a partial, cross-sectional view 200 of an example electronic device (e.g., electronic device 100 from FIG. 1) that includes a housing 202. The housing 202 includes a frame 204 that defines a slot 206. In the cross-section view 200, the slot is located on the left-side of the device. The frame 204 further defines a support surface 208 at a bottom of the slot 206. Additionally, the frame 204 defines an aperture 210 extending through the support surface 208. For illustrative purposes, the electronic device 100 of FIG. 2 only contains housing elements.

Figure 3:
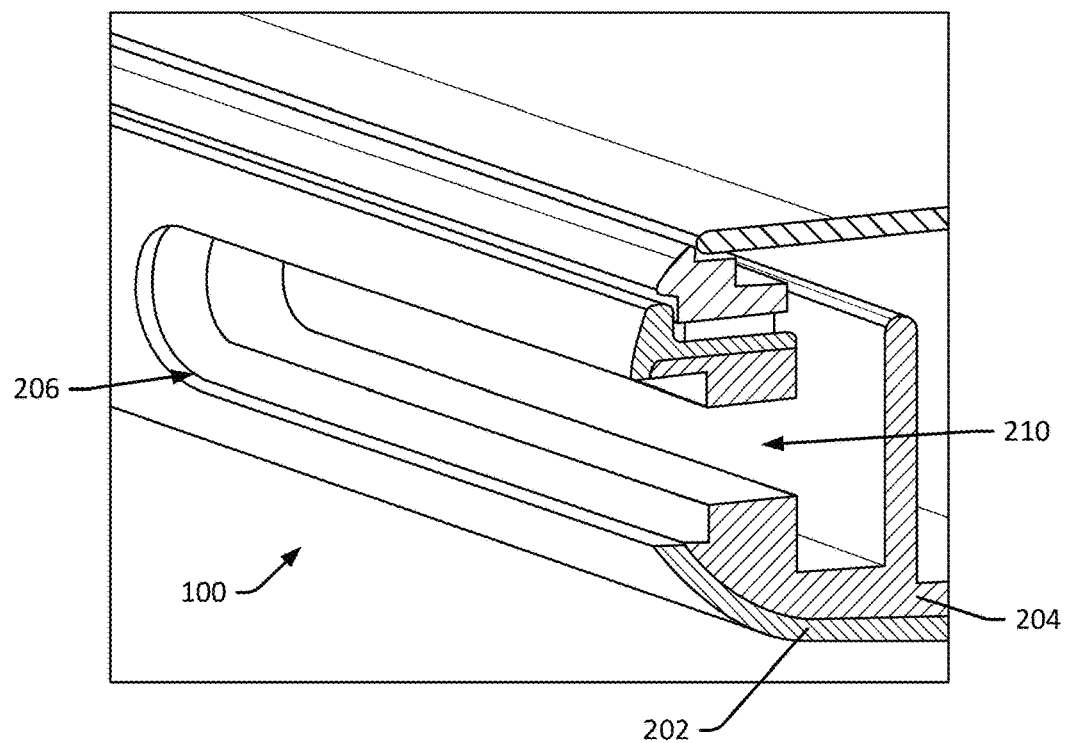
FIG. 3 illustrates a partial, left-side perspective view of the electronic device of FIG. 2, sectioned at a slot and an aperture, which are usable to house an actuator.

FIG. 3 illustrates a partial, left-side perspective view 300 of the electronic device 100 from FIG. 2, sectioned at the slot 206 and the aperture 210, which are usable to house an actuator. The electronic device 100 is illustrated with the frame 204 defining a lengthwise, obround slot (e.g., the slot 206) and the aperture 210 concentric to the slot 206. As described in more detail below, the slot 206 and the aperture 210 may vary in size, location, and/or shape. The size of the slot 206 and/or the size of the aperture 210 may be millimeters to centimeters in length or width. The slot 206 and the aperture 210 may be located on the left-side, right-side, top-end, bottom-end, or back-side of the electronic device 100. The slot 206 and/or the aperture 210 may be substantially elliptical (including circular), substantially rectangular, or a similar shape.

Figure 4:
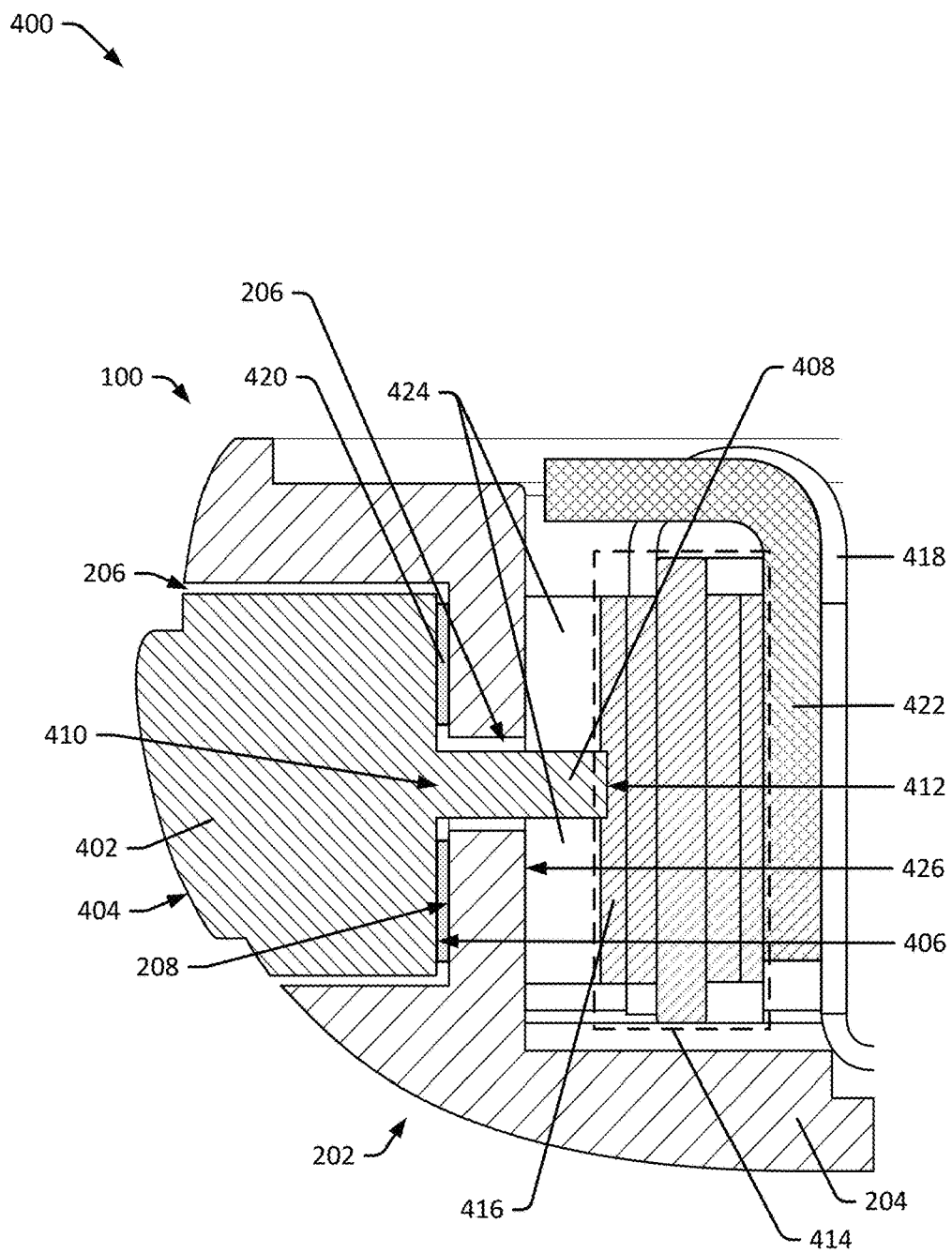
FIG. 4 illustrates a partial, cross-sectional view of the electronic device of FIG. 1, aligned with the cross-sectional view of FIG. 2, and including various hardware components within the housing.

FIG. 4 illustrates a partial, cross-sectional view 400 of the electronic device 100 of FIG. 1, aligned with the cross-sectional view 200 of FIG. 2, and including various hardware components within the housing 202. The electronic device 100 includes an actuator 402 positioned within the slot 206. The actuator 402 includes an exterior surface 404 and a base surface 406 that faces the support surface 208. The exterior surface 404 of the actuator 402, as illustrated in FIG. 4, protrudes from the frame 204. In other implementations, the exterior surface 404 may be recessed within the slot 206 or may be flush with the frame 204. The actuator 402 and the slot 206 may be configured with a clearance fit, such that a defined gap between the actuator 402 and the slot 206 is tens of micrometers wide.

The actuator 402 further includes an extending member 408. The extending member 408 extends from the base surface 406 through an aperture 206 in the support surface 208 at the bottom of the slot 206. The extending member has a first end 410, connected to the base surface 406, and a second end 412, opposite the first end 410. The extending member 408 and aperture 206 may be configured with a clearance fit, such that a defined gap between the extending member 408 and the aperture 206 may be tens to hundreds of micrometers wide.

The electronic device 100 further includes a sensor module 414. The sensor module 414 may be a piezoceramic module having a mechanical interface 416. The sensor module 414 may include circuitry that electrically connects to a flexible printed circuit 418 (e.g., a flexible printed circuit board). The flexible printed circuit 418 may provide power to the sensor module 414. The sensor module 414 is positioned within the housing 202 such that the support surface 208 is arranged between the sensor module 414 and the base surface 406 of the actuator 404. In such an arrangement, when a force is applied to the exterior surface 404 of the actuator 402 ("button press"), the extending member 408 slidably moves in a longitudinal direction through the aperture 206 (e.g., entering one opening of the aperture 206 and exiting an opposite opening of the aperture 206) in the support surface 208 toward the interior of the electronic device 100.

As the extending member 408 moves through the aperture 206, the second end 412 of the extending member 408 engages the sensor module 414. For example, a compressive force applied by the second end 412 of the extending member 408 contacting the sensor module 414 causes a deflection in the mechanical interface 416 of the sensor module 414. Mechanical stress induced within the mechanical interface 416 (e.g., piezoceramic module) by the second end 412 of the extending member 408 generates an electric charge. The electric charge then travels through the circuitry of the sensor module 414 into the flexible printed circuit 418. One or more processors (not shown), located on the flexible printed circuit 418 and/or elsewhere within the housing 202 of the electronic device 100, register the generated electric charge as a button press.

Further to the above descriptions, the sensor module 414 may be a piezoelectric haptic actuator, configured to apply haptic feedback. Haptic feedback is achieved by the one or more processors registering a button press and enabling one or more circuit elements (e.g., capacitors, inductors, battery), located on the flexible printed circuit 418 and/or elsewhere within the housing 202 of the electronic device 100, to transmit an electric charge to the sensor module 414 through the flexible printed circuit 418. As a result, the sensor module 414 generates a force output that expands the mechanical interface 416 to apply a force to the second end 412 of the extending member 408.

In an example, when the mechanical interface 416 of the sensor module 414 deflects due to a button press, circuitry in the sensor module 414 transmits the generated electric charge through the flexible printed circuit 418 to one or more processors. The one or more processors direct other circuit elements to transmit a response electric charge through the flexible printed circuit 418 to the sensor module 414, inducing an electric field in a polarization direction of the sensor module 414. As a result, the mechanical interface 416 of the sensor module 414 deforms in the opposite direction of the compressive force. The sensor module 414 may be configured to oscillate the intensity of the electric field so as to provide a vibrating haptic feedback, transmitted through the actuator 402, to the user.

The electronic device 100 may further include PSA 420 positioned between the base surface 406 of the actuator 402 and the support surface 208 of the frame 204. The PSA 420 is aligned with the base surface 406 of the actuator 402 and surrounds an opening of the aperture 206 in the support surface 208 at the bottom of the slot 206. The PSA 420 may vary in shape depending on the shape of the aperture 206 and/or the base surface 406 of the actuator 402. Accordingly, the PSA 420 may have a shape that corresponds to, or substantially matches, the shape of the base surface 406 of the actuator 402. In one example, the PSA includes a substantially obround shape with a hole defined in its center that corresponds to, and is aligned with, the aperture 206 defined in the support surface 208 of the frame 204. In aspects, the base surface 406 of the actuator 402 is bonded to the support surface 208 of the frame 204 by the PSA 420.

The PSA 420 is configured to create a seal between the actuator 402 and the support surface 208. In so doing, the PSA 420 prevents contaminants from entering into the housing 202 of the electronic device 100 through the aperture 206. For example, the PSA 420 provides waterproofing capability for the sensor module 414 and further inhibits dust and debris from entering the electronic device 100 through the aperture 206.

In addition to the above descriptions, the PSA 420 may form a compressible interface between the actuator 402 and the sensor module 414. When a user applies a force to the exterior surface 404 of the actuator 402, the PSA 420 is configured to, first, compress, enabling slidable movement of the actuator 402 (e.g., on the order of approximately 15 microns) such that the second end 412 of the extending member 408 contacts the sensor module 414, and, second, expand to an approximate original thickness after the user releases the actuator 402.

The electronic device 100 may integrate the disclosed techniques and apparatuses in a variety of arrangements. For example, FIG. 4 illustrates the sensor module 414 positioned between the actuator 402 and a bracket 422. The bracket 422 supports the sensor module 414 and resists the compression force applied to the sensor module 414 by the second end 412 of the extending member 408 of the actuator 402.

The electronic device 100 of FIG. 4 further includes one or more foam carriers. In the illustrated example of FIG. 4, a foam carrier 424 may be positioned proximate to a second surface 426 of the frame 204 that is opposite the support surface 208. In so doing, the foam carrier 424 is located between the sensor module 414 and the frame 204 (e.g., between the sensor module 414 and the second surface 426 of the frame 204). The foam carrier 424 may define an additional aperture through which the extending member 408 of the actuator 402 extends. The foam carrier 424 is configured to account for a tolerance variation of the sensor module 414. In another example, the foam carrier 424 may be positioned between the sensor module 414 and the bracket 422 such that the sensor module 414 is located between the foam carrier 424 and the extending member 408. In other implementations, the above examples may be combined to include one or more of (i) a first portion of the foam carrier 424 positioned between the sensor module 414 and the frame 204, or (ii) a second portion of the foam carrier 424 positioned between the sensor module 414 and the bracket 422. The first portion of the foam carrier 424 may be a different type of foam carrier than the second portion of the foam carrier 424.

Figure 5:
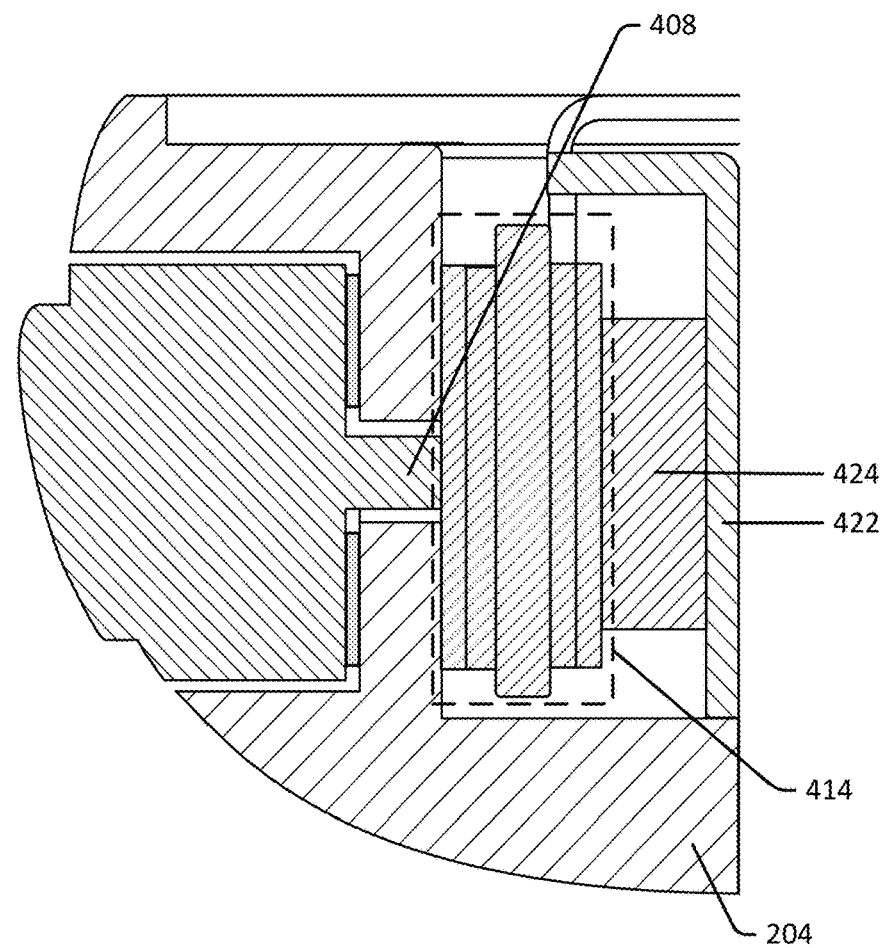
FIG. 5 illustrates a partial, cross-sectional view of the electronic device of FIG. 2 with another hardware arrangement.

In other arrangements, consider FIG. 5, which illustrates a partial, cross-sectional view 500 of the electronic device of FIG. 2 with another example hardware arrangement. In FIG. 5, the foam carrier 424 may be positioned proximate to the bracket 422 such that the foam carrier 424 is between the bracket 422 and the sensor module 414. In this arrangement, the sensor module 414 is located between the foam carrier 424 and the extending member 408. In other implementations, aspects of the example arrangements described in FIGS. 4 and 5 may be combined to include one or more of (i) a first portion of the foam carrier 424 positioned between the sensor module 414 and the frame 204, or (ii) a second portion of the foam carrier 424 positioned between the sensor module 414 and the bracket 422.

CONCLUSION

Although aspects of localized haptic feedback in electronic devices using pressure-sensitive adhesive and piezoelectric haptic actuators have been described in language specific to features and/or methods, the subject of the appended claims is not necessarily limited to the specific features or methods described. Rather, the specific features and methods are disclosed as example implementations of localized haptic feedback in electronic devices using pressure-sensitive adhesive and piezoelectric haptic actuators, and other equivalent features and methods are intended to be within the scope of the appended claims. Further, various different aspects are described, and it is to be appreciated that each described aspect can be implemented independently or in connection with one or more other described aspects.

What is claimed is:

1. An electronic device comprising:
a housing having a frame defining a slot, the frame comprising a support surface that defines a bottom of the slot;
an actuator positioned within the slot, the actuator having:
a base surface that faces the support surface at the bottom of the slot; and
an extending member extending from the base surface and through an aperture in the support surface at the bottom of the slot, the extending member having a first end connected to the base surface and a second end that is opposite the first end;
a sensor module positioned within the housing such that the support surface of the frame is positioned between the sensor module and the base surface of the actuator, the sensor module positioned proximate to the second end of the extending member to enable the second end of the extending member to contact the sensor module when a force applied to an exterior surface of the actuator causes the extending member to slidably move through the aperture and toward the sensor module, the sensor module configured to:
detect a compression force applied by the second end of the extending member to the sensor module; and
apply haptic feedback to the second end of the extending member; and
a pressure-sensitive adhesive positioned between the base surface of the actuator and the support surface of the frame, the pressure-sensitive adhesive configured to:
provide waterproofing capability for the sensor module; and
form a compressible interface between the actuator and the sensor module.

2. The electronic device of claim 1, wherein the sensor module is a piezoelectric haptic actuator.

3. The electronic device of claim 1, wherein:
the sensor module is a piezoceramic module having a mechanical interface;
the compression force applied by the second end of the extending member causes a deflection in the mechanical interface;
the sensor module is configured to register a button press based on the deflection; and
the sensor module is configured to apply the haptic feedback by generating a force output that expands the mechanical interface to apply an additional force to the second end of the extending member.

4. The electronic device of claim 1, wherein the base surface of the actuator is bonded to the support surface of the frame by the pressure-sensitive adhesive.

5. The electronic device of claim 1, wherein the pressure-sensitive adhesive is configured to:
compress when a user presses the actuator; and
expand to an approximate original thickness after the user releases the actuator.

6. The electronic device of claim 1, wherein the pressure-sensitive adhesive is generally obround and surrounds an opening of the aperture in the support surface at the bottom of the slot.

7. The electronic device of claim 1, wherein the pressure-sensitive adhesive enables slidable movement of the actuator on the order of approximately 15 microns.

8. The electronic device of claim 1, further comprising a bracket configured to support the sensor module and resist the compression force applied to the sensor module by the second end of extending member of the actuator, wherein the sensor module is positioned between the actuator and the bracket.

9. The electronic device of claim 8, further comprising a flexible printed circuit electrically connected to the sensor module and configured to provide power to the sensor module, the bracket positioned between the flexible printed circuit and the sensor module.

10. The electronic device of claim 8, further comprising a foam carrier positioned between the sensor module and the bracket such that the sensor module is located between the foam carrier and the extending member, the foam carrier configured to account for a tolerance variation of the sensor module.

11. The electronic device of claim 1, further comprising a foam carrier positioned proximate to a second surface of the frame that is opposite the support surface, the foam carrier located between the sensor module and the support surface of the frame, the foam carrier defining an additional aperture, the extending member extending through the additional aperture in the foam carrier, the foam carrier configured to account for a tolerance variation of the sensor module.

12. The electronic device of claim 1, wherein the pressure-sensitive adhesive is configured to create a moisture seal between the actuator and the support surface to prevent moisture from ingressing into the electronic device through the aperture and to the sensor module.

* * * * *